(12) United States Patent
Yoon et al.

(10) Patent No.: US 8,357,938 B2
(45) Date of Patent: Jan. 22, 2013

(54) ORGANIC LIGHT EMITTING DISPLAY DEVICE HAVING EXTERNAL LIGHT TRANSMISSION AREA

(75) Inventors: Seok-Gyu Yoon, Yongin (KR); Jae-Heung Ha, Yongin (KR); Kyu-Hwan Hwang, Yongin (KR); Young-Woo Song, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/156,169

(22) Filed: Jun. 8, 2011

(65) Prior Publication Data

US 2012/0049215 A1   Mar. 1, 2012

(30) Foreign Application Priority Data

Aug. 24, 2010   (KR) .................. 10-2010-0082100

(51) Int. Cl.
*H01L 29/04* (2006.01)
(52) U.S. Cl. ............. 257/59; 257/E33.07; 257/E33.065; 257/E31.124; 345/76
(58) Field of Classification Search ............... 257/59, 257/79; 349/157; 345/78
See application file for complete search history.

(56) References Cited

U.S. PATENT DOCUMENTS

| | | | |
|---|---|---|---|
| 2005/0280361 A1* | 12/2005 | Uhlig et al. | 313/504 |
| 2009/0284449 A1* | 11/2009 | Lee et al. | 345/76 |
| 2010/0045575 A1* | 2/2010 | Kim | 345/76 |

FOREIGN PATENT DOCUMENTS

| | | |
|---|---|---|
| JP | 10-039757 A | 2/1998 |
| JP | 2001-341336 A | 12/2001 |
| JP | 2005-345946 A | 12/2005 |
| JP | 2006-311856 A | 11/2006 |
| KR | 10-0570993 B1 | 4/2006 |
| KR | 10-0684835 B1 | 2/2007 |

* cited by examiner

*Primary Examiner* — Marcos D. Pizarro
*Assistant Examiner* — Cesar Lopez
(74) *Attorney, Agent, or Firm* — Knobbe Martens Olson & Bear LLP

(57) ABSTRACT

An organic light-emitting display device that is transparent and prevents distortion of an image transmitted therethrough by preventing light from scattering during image display. The organic light-emitting display device comprises a plurality of pixels, in which each pixel includes a light transmission area, a light emitting area, and a light absorption area. The light transmission area is configured to pass visible light incident thereto. The light absorption is configured to absorb visible light incident thereto.

20 Claims, 10 Drawing Sheets

ORGANIC LIGHT EMITTING DISPLAY DEVICE HAVING EXTERNAL LIGHT TRANSMISSION AREA

CROSS-REFERENCE TO RELATED PATENT APPLICATION

This application claims the benefit of Korean Patent Application No.10-2010-0082100, filed on Aug. 24, 2010, in the Korean Intellectual Property Office, the disclosure of which is incorporated herein in its entirety by reference.

BACKGROUND

1. Field The present disclosure relates to an organic light-emitting display device, and more particularly, to a transparent organic light-emitting display device.

2. Description of the Related Art

Organic light-emitting display devices generally have wide viewing angles, high contrast ratios, short response times, and reduced power consumption, and thus may be used across a variety of applications, such as personal portable devices (e.g., MP3 players and mobile phones) or large screen displays (e.g., television sets).

An organic light-emitting display device can be manufactured as a transparent display device by including transparent thin film transistors and transparent organic light emitting devices. When a transparent display device is in an off-state, an object or an image positioned on a side of the device can be transmitted to the other side through organic light-emitting diodes, thin film transistors and various wires and further through open spaces between the patterns. The patterns of organic light-emitting diodes, thin film transistors, and wires do not have a high transmittance. While open spaces have a higher transmittance, the open spaces between the patterns are not large. Thus, transmittance of the entire transparent display device may not be high.

Also distorted images may be transmitted to the user due to the patterns of organic light-emitting diodes, thin film transistors, and wires. The reason is that gaps between the patterns are a few nanometers, and they overlap with wavelengths of visible light, thus causing light to scatter as it passed through.

SUMMARY

One or more aspects of the present invention provide a transparent organic light-emitting display device that can prevent or reduce distortion of images transmitted therethrough by preventing light from scattering or reducing such scattering.

According to one aspect of the present invention, there is provided an organic light-emitting display device including: a substrate; a plurality of pixels formed on the substrate, each of the plurality of pixels including a first region which is a light-emitting region and a second region for transmitting external light; a plurality of pixel circuit units formed in the first regions corresponding to the plurality of pixels, respectively, each of the plurality of pixel circuit units including at least one thin film transistor; a first insulating layer covering the plurality of pixel circuit units; a plurality of first electrodes formed on the first insulating layer, disposed in the first regions of the plurality of pixels, respectively, to be separated from one another, and electrically connected to the plurality of pixel circuit units, respectively; a second insulating layer formed on the first insulating layer to cover edges of the plurality of first electrodes, formed of a light absorbing material, and including a plurality of first transmittance windows formed on locations corresponding to the plurality of second regions, respectively; an organic layer formed on the plurality of first electrodes; and a second electrode formed on the organic layer and the second insulating layer, wherein the second electrode ranges from the first region to the second region of all the plurality of pixels.

The plurality of first electrodes may be transmittance electrodes.

The plurality of first electrodes may be reflective electrodes.

The plurality of first transmittance windows corresponding to the plurality of pixels, respectively, may be disposed to be separated from one another.

In the organic light-emitting display device, from among the plurality of first transmittance windows, first transmittance windows corresponding to at least two adjacent pixels from among the plurality of pixels are connected to each other.

The second electrode includes a plurality of second transmittance windows connected to the plurality of first transmittance windows, respectively.

The first insulating layer includes a plurality of third electrodes connected to the plurality of first transmittance windows, respectively.

The first region of each of the plurality of pixels includes a light-emitting region and a circuit region, wherein the at least one thin film transistor is disposed in the circuit region, one of the plurality of first electrodes is disposed in the light-emitting region, and the light-emitting region and the circuit region of each of the plurality of pixels are disposed adjacent to each other.

The first region of each of the plurality of pixels includes a light-emitting region and a circuit region, wherein one of the plurality of pixel circuit units is disposed in the circuit region, one of the plurality of first electrodes is disposed in the light-emitting region, and the light-emitting region overlaps with the circuit region so as to cover the circuit region.

In the organic light-emitting display device, an area of the first electrode of each of the plurality of pixels is equal to an area of each of the plurality of first regions.

According to one aspect of the present invention, there is provided an organic light-emitting display device including: a substrate; a plurality of pixels formed on the substrate, each of the plurality of pixels including a first region which is a light-emitting region and a second region for transmitting external light; a plurality of thin film transistors disposed in the first regions of the plurality of pixels, respectively; a plurality of first electrodes formed in the first regions of the plurality of pixels, respectively, to be separated from one another and electrically connected to the plurality of thin film transistors, respectively; an insulating layer covering edges of the plurality of first electrodes, formed of a light absorbing material, and including a plurality of first transmittance windows formed on locations corresponding to the plurality of second regions, respectively; an organic layer formed on the plurality of first electrodes; and a second electrode formed on the organic layer and the insulating layer, wherein the second electrode ranges from the first region to the second region of all the plurality of pixels.

The plurality of first electrodes may be transmittance electrodes.

The plurality of first electrodes may be reflective electrodes.

The plurality of first transmittance windows corresponding to the plurality of pixels, respectively, may be disposed to be separated from one another.

In the organic light-emitting display device, from among the plurality of first transmittance windows, first transmittance windows corresponding to at least two adjacent pixels from among the plurality of pixels are connected to each other.

The second electrode includes a plurality of second transmittance windows connected to the plurality of first transmittance windows, respectively.

The organic light-emitting display device may further include at least one insulating layer, wherein the at least one insulating layer includes a plurality of third electrodes connected to the plurality of first transmittance windows, respectively.

The first region of each of the plurality of pixels includes a light-emitting region and a circuit region, wherein one of the plurality of thin film transistors is disposed in the circuit region, one of the plurality of first electrodes is disposed in the light-emitting region, and the light-emitting region and the circuit region of each of the plurality of pixels are disposed adjacent to each other.

The first region of each of the plurality of pixels includes a light-emitting region and a circuit region, wherein one of the plurality of thin film transistors is disposed in the circuit region, one of the plurality of first electrodes is disposed in the light-emitting region, and the light-emitting region overlaps with the circuit region so as to cover the circuit region.

In the organic light-emitting display device, an area of the first electrode of each of the plurality of pixels may be equal to an area of each of the plurality of first regions.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Hereinafter, exemplary embodiments of the present invention will be described more fully with reference to the accompanying drawings.

Figure 1:
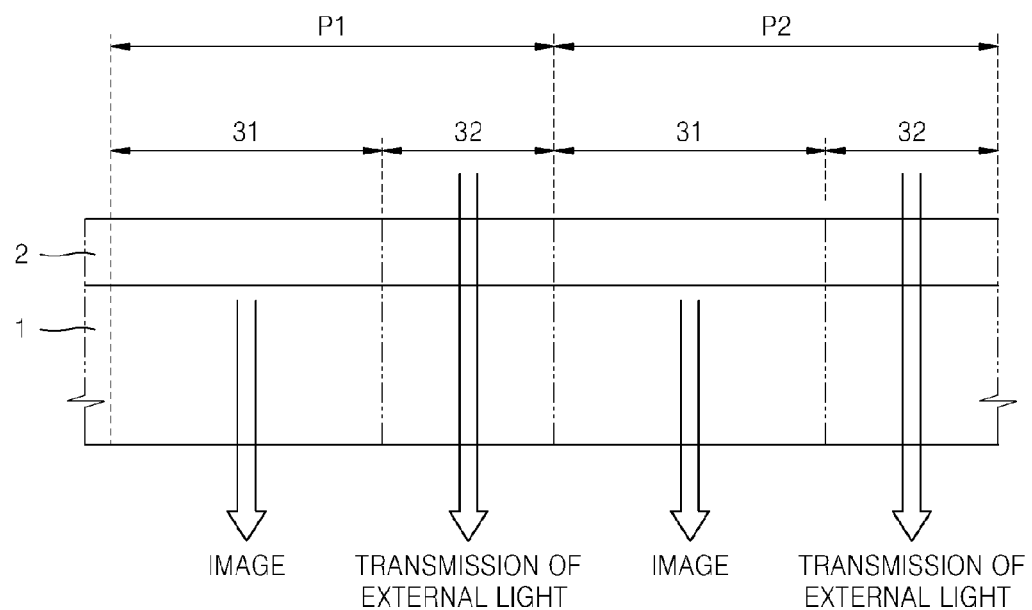
FIG. 1 is a schematic cross-sectional view of an organic light-emitting display device according to an embodiment of the present invention.

FIG. 1 is a schematic cross-sectional view of an organic light-emitting display device according to an embodiment of the present invention. Referring to FIG. 1, the organic light-emitting display device includes a substrate 1 and a display unit 2 disposed over the substrate 1.

External light passes through the substrate 1 and the display unit 2 to be incident on the organic light-emitting display device.

Figure 2:
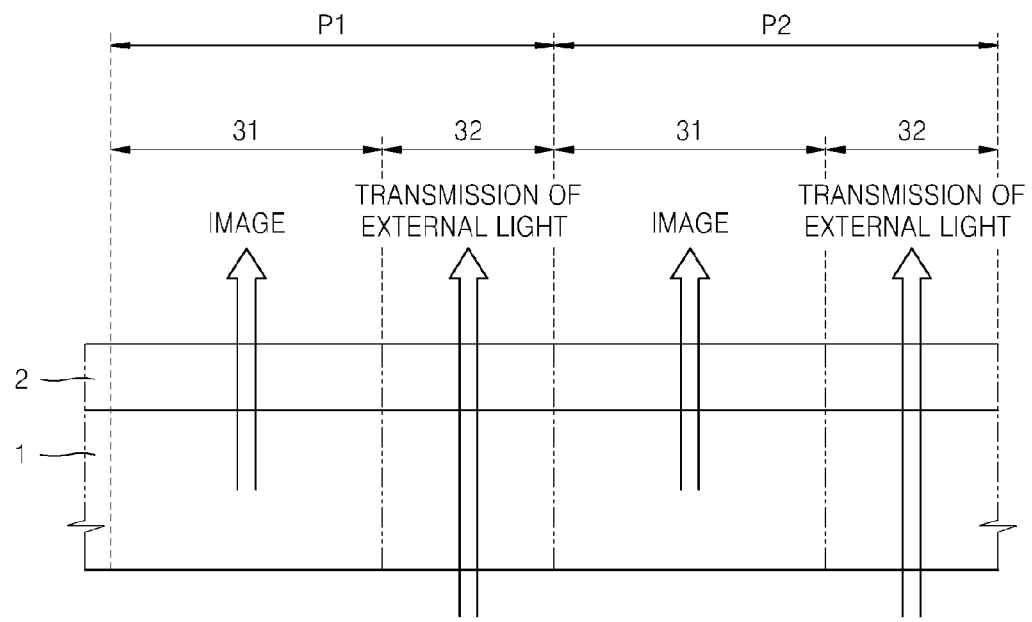
FIG. 2 is a schematic cross-sectional view of an organic light-emitting display device according to another embodiment of the present invention.

As will be described later, the display unit 2 is configured to transmit external light. Referring to FIG. 1, the display unit 2 is substantially transparent such that a user positioned on one side of the device can view objects located on the other side through the substrate 1. Although the organic light-emitting display device illustrated in FIG. 1 is a bottom emission type device in which an image is displayed on the display unit 2 through the substrate 1, the present invention is not limited thereto. The organic light-emitting display device according to an embodiment of the present invention may be a top emission type device in which an image is displayed on the display unit 2 to be away from the substrate 1, as illustrated in FIG. 2. Thus, a user may view an image displayed on the display unit 2, or outer image below the substrate 1. Also, the present invention is not limited to the embodiments of FIGS. 1 and 2, and an organic light-emitting display device according to an embodiment of the present invention may be a double emission type device in which an image is displayed on the display unit 2 in both directions, i.e., toward the substrate 1 and to be away from the substrate 1.

In FIGS. 1 and 2, P1 and P2 denote a first pixel and a second pixel that are adjacent to each other, respectively. Each of the first and second pixels P1 and P2 includes a first region 31 and a second region 32.

An image is displayed on the display unit 2 via the first region 31, and external light is transmitted via the second region 32.

In the current embodiment, since both the first and second pixels P1 and P2 include the first region 31 for displaying an image and the second region 32 for transmitting external light, thereby allowing a user to view images of an external object while the display unit 2 does not display an image.

In embodiments, less transparent components, such as a thin film transistor (TFT), a capacitor, and an organic light-emitting diode, may not be formed in the second region 32 so as to maximize the transmissivity of external light through the second region 32. Accordingly, the overall transmissivity of external light through the display unit 2 can be increased, and external images transmitted therethrough may be less distorted or interfered.

Figure 3:
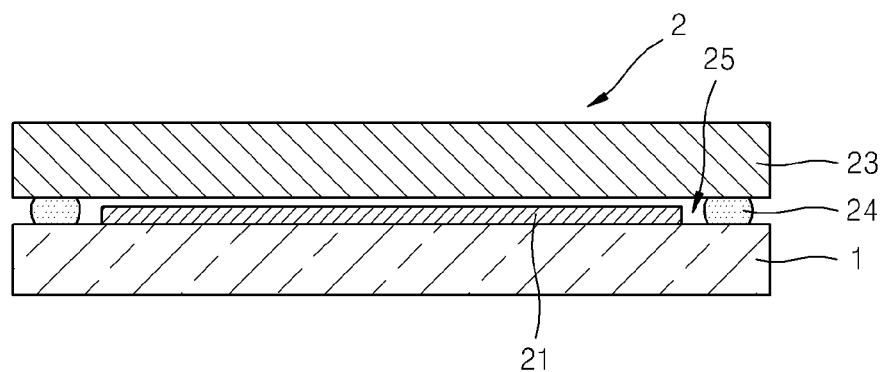
FIG. 3 is a cross-sectional view specifically illustrating the organic light-emitting display device of FIG. 1 or 2, according to an embodiment of the present invention.

FIG. 3 is a cross-sectional view specifically illustrating the organic light-emitting display device of FIG. 1 or 2, according to an embodiment of the present invention. Referring to FIG. 3, the display unit 2 includes an organic emission unit 21 formed on the substrate 1, and a sealing substrate 23 for sealing the organic emission unit 21.

In embodiments, the sealing substrate 23 may be formed of a transparent material to allow viewing of an image generated by the organic emission unit 21 and to prevent external air and moisture from penetrating into the organic emission unit 21.

A space 25 between the substrate 1 and the sealing substrate 23 is sealed by sealing edges of the substrate 1 and the sealing substrate 23 with sealing materials 24. In some embodiments, the space 25 may be filled with an absorbent or a filler.

Figure 4:
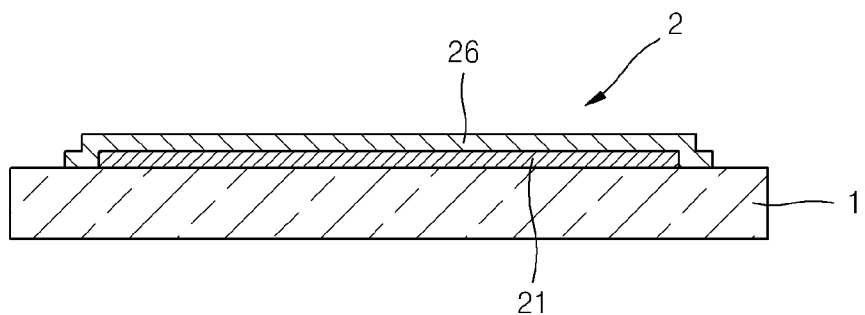
FIG. 4 is a cross-sectional view specifically illustrating the organic light-emitting display device of FIG. 1 or 2, according to another embodiment of the present invention.

As illustrated in FIG. 4, in other embodiments, a thin sealing film 26 (instead of the sealing substrate 23) may be formed on the organic emission unit 21 so as to protect the organic emission unit 21 from air. The thin sealing film 26 may have, but is not limited to, a structure in which a film formed of an inorganic material (for example, a silicon oxide or a silicon nitride) and a film formed of an organic material (for example, epoxy or polyimide) are alternately stacked. The thin sealing film 26 may be transparent and can be formed of any thin film type sealing structure. Although not shown, the thin sealing film 26 of FIG. 4 and the sealing substrate 23 of FIG. 3 may be sequentially formed so as to seal the organic emission unit 21.

Figure 5:
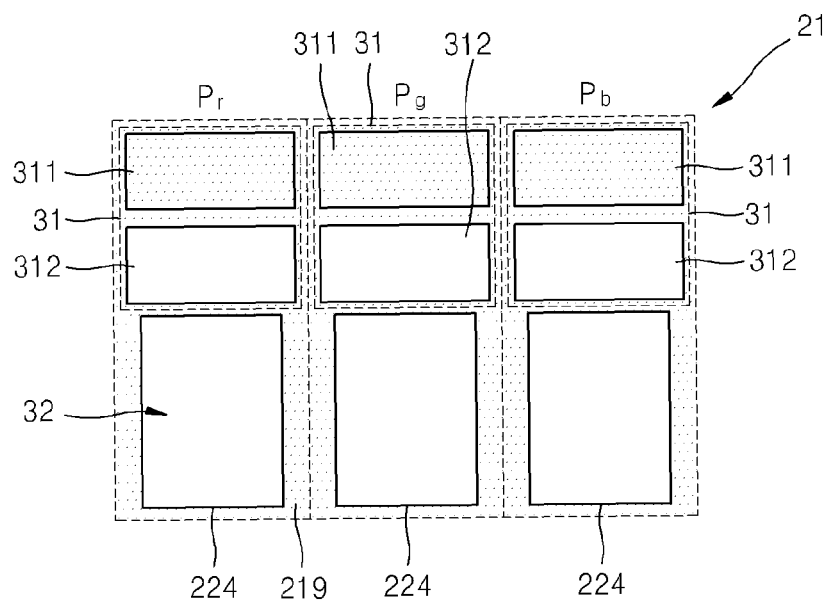
FIG. 5 is a schematic plan view of an organic emission unit included in the organic light-emitting display device of FIG. 3 or 4, according to an embodiment of the present invention.

Various embodiments of the organic emission unit 21 according to the present invention will now be described. FIG. 5 is a schematic plan view of the organic emission unit 21 included in the organic light-emitting display device of FIG. 3 or 4, according to an embodiment of the present invention. Referring to FIG. 5, a red pixel Pr, a green pixel Pg, and a blue pixel Pb are arranged to be adjacent to one another in the organic emission unit 21. Each of the red pixel Pr, the green pixel Pg, and the blue pixel Pb includes a first region 31, which further includes a circuit region 311 and a light-emitting region 312. The circuit region 311 and the light-emitting region 312 are arranged to be adjacent to each other. Each of the red pixel Pr, the green pixel Pg, and the blue pixel Pb further includes a second region 32 for transmitting external light, that is provided adjacent to the first region 31.

Figure 6:
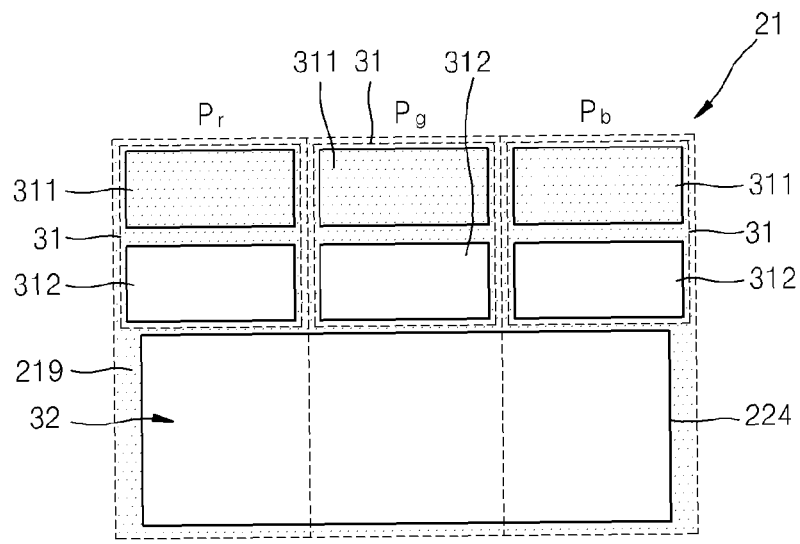
FIG. 6 is a schematic plan view of the organic emission unit included in the organic light-emitting display device of FIG. 3 or 4, according to another embodiment of the present invention.

In the organic emission unit 21, the second regions 32 of the red pixel Pr, the green pixel Pg, and the blue pixel Pb may be formed separately from one another as illustrated in FIG. 5. Alternatively, a single second region 32 may be provided for the red pixel Pr, the green pixel Pg, and the blue pixel Pb as illustrated in FIG. 6. In the embodiment of FIG. 6, the whole area of the second regions 32 for transmitting external light is large, thereby increasing the whole transmissivity of the display unit 2 comparing to the embodiment of FIG. 5.

Although FIG. 6 illustrates that the second region 32 for the red pixel Pr, the green pixel Pg, and the blue pixel Pb is a single large area, the present invention is not limited thereto. In some embodiments, the light transmitting area (second region 32) may be of two adjacent pixels among the red pixel Pr, the green pixel Pg, and the blue pixel Pb.

Figure 7:
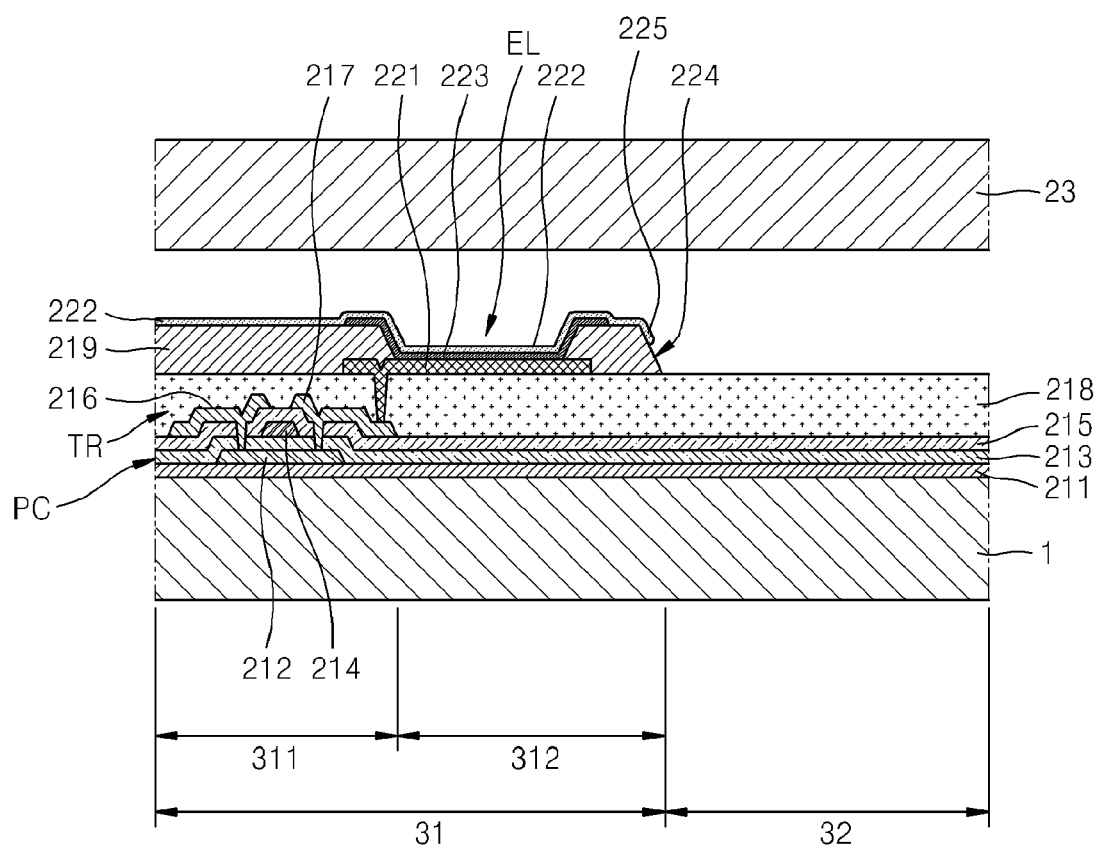
FIG. 7 is a schematic cross-sectional view of a pixel of the organic emission unit included in the organic light-emitting display device of FIG. 3 or 4, according to an embodiment of the present invention.

FIG. 7 is a schematic cross-sectional view of a pixel among the red, green, and blue pixels Pr, Pg, and Pb illustrated in FIG. 5 or 6 of the organic emission unit 21, which is part of the organic light-emitting display device of FIG. 3 or 4, according to an embodiment of the present invention. Although FIG. 7 illustrates that a thin film transistor (TFT) TR is formed in the circuit region 311, the present invention is not limited thereto and a pixel circuit unit PC may include a TFT TR in the circuit region 311. Although not shown, the pixel circuit unit PC may further include a plurality of TFTs, a storage capacitor, and wires, such as a scan line, a data line, and a Vdd line.

An organic light-emitting diode EL is disposed or formed in the light-emitting region 312. The organic light-emitting diode EL is electrically connected to the TFT TR of the pixel circuit unit PC.

A buffer layer 211 is formed on the substrate 1, and the pixel circuit unit PC including the TFT TR is formed on the buffer layer 211. A semiconductor active layer 212 is formed on the buffer layer 211.

The buffer layer 211 is formed of a transparent insulating material, prevents impurity elements from penetrating into the organic emission unit 21, and planarizes a surface of the organic emission unit 21. The buffer layer 211 may be formed of any of various materials that can perform the functions described above. For example, the buffer layer 211 may be formed of an inorganic material such as silicon oxide, silicon nitride, silicon oxynitride, aluminum oxide, aluminum nitride, titanium oxide, or titanium nitride, an organic material such as polyimide, polyester, or acryl, or stacks of these materials. In some embodiments of the present invention, the buffer layer 211 may be omitted.

The semiconductor active layer 212 may be formed of polycrystalline silicon, but is not limited thereto and may be formed of an oxide semiconductor. For example, the semiconductor active layer 212 may be a G-I-Z-O layer [$(In_2O_3)a(Ga_2O_3)b(ZnO)c$ layer], wherein a, b, and c are integers that respectively satisfy $a \geq 0$, $b \geq 0$, and $c > 0$. If the semiconductor active layer 212 is formed of an oxide semiconductor, the transmissivity of the circuit region 311 of the first region 31 may be improved, thereby increasing the overall transmissivity of the display unit 2.

In the illustrated embodiment, a gate insulating layer 213 is formed on the buffer layer 211 by using a transparent insulating material so as to cover the semiconductor active layer. A gate electrode 214 is formed on the gate insulating layer 213. An interlayer insulating layer 215 is formed on the gate insulating layer 213 by using a transparent insulating layer to cover the gate electrode 214. Source and drain electrodes 216 and 217 are formed on the interlayer insulating layer 215, and contact each other via the semiconductor active layer 212 and a contact hole (not shown), respectively. The structure of the TFT TR is not limited thereto, and any of various types of TFT structures may be employed.

A first insulating layer 218 is formed covering the pixel circuit unit PC including the TFT TR. The first insulating layer 218 may be a single layer or multiple layers of insulating film, an upper surface of which is planarized. The first insulating layer 218 may be formed of an inorganic insulating material and/or an organic insulating material. The first insulating layer 218 may be formed covering all pixels.

Referring to FIG. 7, a first electrode 221 of the organic light-emitting diode EL is formed on the first insulating layer 218 to be electrically connected to the TFT TR. Each of a plurality of the first electrodes 221 may be formed in an island pattern to be separated from the other first electrodes 221.

A second insulating layer 219 formed of an organic insulating layer and/or an inorganic insulating layer, is formed on the first insulating layer 218. The second insulating layer 219 is formed covering edges of the first electrode 221 while exposing a central part of the first electrode 221. The second insulating layer 219 may be formed to cover the first and second regions 31 and 32 corresponding to each of the pixels, and may be formed to completely cover the organic emission layer 21 of the substrate 1. However, the second insulating layer 219 may not be formed to completely cover the first region 31 as long as at least a part of, and particularly, the edges of the first electrode 221 can be covered by the second insulating layer 219.

Although FIG. 7 illustrates the second insulating layer 219 in a single layer, the present invention is not limited thereto and the second insulating layer 219 may include a plurality of layers. Also, the second insulating layer 219 may not be formed evenly as illustrated in FIG. 7, and spacers formed of the same material used to form the second insulating layer 219 may protrude from an upper surface of the second insulating layer 219 so as to support the sealing substrate 23.

In the current embodiment, the second insulating layer 219 may include a light absorbing material. The light absorbing material may be a colorant of black or a dark color similar to black, and may be included in an organic material and/or an inorganic material used to form the second insulating layer 219.

In the current embodiment, since the second insulating layer 219 includes the light absorbing material, conductive patterns of the elements and wires of the pixel region 311 formed right below the second insulating layer 219 are blocked or hidden by the second insulating layer 219. In particular, referring to FIG. 7, since the TFT TR is hidden by the second insulating layer 219, a user cannot view a conductive pattern of the TFT TR from a lower surface of the substrate 1 or an upper surface of the sealing substrate 23, thereby preventing or minimizing image distortion or color separation from occurring, caused by the conductive pattern of the TFT TR.

As described above, the first insulating layer 218, the interlayer insulating layer 215, the gate insulating layer 213, and the buffer layer 211 are formed of a transparent insulating material, and thus, external light can pass through even the circuit region 311 of the first region 31 as illustrated in FIG. 7. Thus, the conductive patterns of the TFT TR and the other devices and wires included in the circuit region 311 may act as multiple slits, via which external light may penetrate the circuit region 311. Thus, an external image penetrating the circuit region 311 may be distorted, and even color separation may occur.

In order to solve this problem, in the current embodiment, the light absorbing material is included in the second insulating layer 219 formed on the conductive patterns so as to prevent the multiple slit effect from occurring, thereby preventing image distortion and color separation.

However, if the light absorbing material is included in the second insulating layer 219, the transmissivity of the second region 32 for transmitting external light may be lowered. In order to address this, in the current embodiment, a first transmittance window 224 is formed in the second region, more specifically at a location corresponding to the second insulating layer 219.

The first transmittance window 224 may be formed by removing or not forming the second insulating layer 219 in the second region 32. The first transmittance window 224 may be formed in an island pattern surrounded by sea of the second insulating layer 219. For example, a plurality of the first transmittance windows 224 corresponding to the red pixel Pr, the green pixel Pg, and the blue pixel Pb, respectively, may be formed separately from one another as illustrated in FIG. 5 or may be connected to one another as illustrated in FIG. 6. Although FIG. 6 illustrates that all the plurality of first transmittance windows 224 corresponding to the red pixel Pr, the green pixel Pg, and the blue pixel Pb, respectively, are connected to one another, the present invention is not limited thereto, and only the first transmittance windows 224 corresponding to two adjacent pixels from among the red pixel Pr, the green pixel Pg, and the blue pixel Pb may be connected to each other.

If the plurality of first transmittance windows 224 are formed as illustrated in FIG. 6, each of the plurality of first transmittance windows 224 is large. Thus, not only the transmissivity of each of the plurality of first transmittance windows 224 is high but also an external image may be prevented from scattering.

An organic layer 223 and a second electrode 222 are sequentially formed on the first electrode 221. The second electrode covers the organic layer 223 and the second insulating layer 219 and is electrically connected to all the pixels.

The organic layer 223 may be a low molecular weight organic film or a polymer organic film having a large molecular weight. If the organic emission layer 223 is a low molecular weight organic film, then the organic emission layer 223 may be formed by stacking a hole injection layer (HIL), a hole transport layer (HTL), an emission layer (EML), an electron transport layer (ETL), and an electron injection layer (EIL) in a single structure or a composite structure, and may be formed of any of various materials such as copper phthalocyanine (CuPc), N,N'-Di(naphthalene-1-yl)-N,N'-diphenyl-benzidine (NPB), or tris-8-hydroxyquinoline aluminum (Alq3). The low-molecular weight organic layer may be formed by vacuum deposition. In this regard, the HIL, the HTL, the ETL, and the EIL are common layers to be commonly applied to the red, green, and blue pixels Pr, Pg, and Pb.

The first electrode 221 may function as an anode, and the second electrode 222 may function as a cathode. Alternatively, the first electrode 221 may function as a cathode, and the second electrode 222 may function as an anode.

According to an embodiment of the present invention, the pixel electrode 221 may be a reflective electrode and the opposite electrode 222 may be a transparent electrode. The pixel electrode 221 may include an oxide having a high work function, such as ITO, IZO, ZnO, or $In_2O_3$. The second electrode 222 may be formed of metal having a low work function, such as silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca). Accordingly, the organic light-emitting diode EL is a bottom emission type in which an image is displayed toward the first electrode 221. However, the present invention is not limited thereto, and the second electrode 222 may be a transparent electrode or a semi-transparent electrode.

The sealing substrate 23 may be disposed on the second electrode 222. As illustrated in FIG. 3, the sealing substrate 23 is combined with the substrate 1 via the sealing materials 24, thereby sealing the display unit 2 to be protected from air. A space between the sealing substrate 23 and the second substrate 222 may be filled with an additional filler or absorbent (not shown). The sealing of the display unit 2 is not limited to using the sealing substrate 23 illustrated in FIG. 7, and the thin sealing film 26 of FIG. 4 may be used to seal the display unit 2.

In the current embodiment, a second transmittance window 225 may further be formed in the second electrode 222. The second transmittance window 225 may be formed by removing or not forming the second electrode 222 in the second region 32. The second transmittance window 225 may overlap the first transmittance window 224. The second transmittance window 225 may also be formed in an island pattern similar to the first transmittance window 224 illustrated in FIG. 5 or 6.

Although not shown, an additional transmittance window overlapping the first transmittance window 224 may further be formed in at least one from among the interlayer insulating layer 215, the gate insulating layer 213, and the buffer layer 211.

Figure 8:
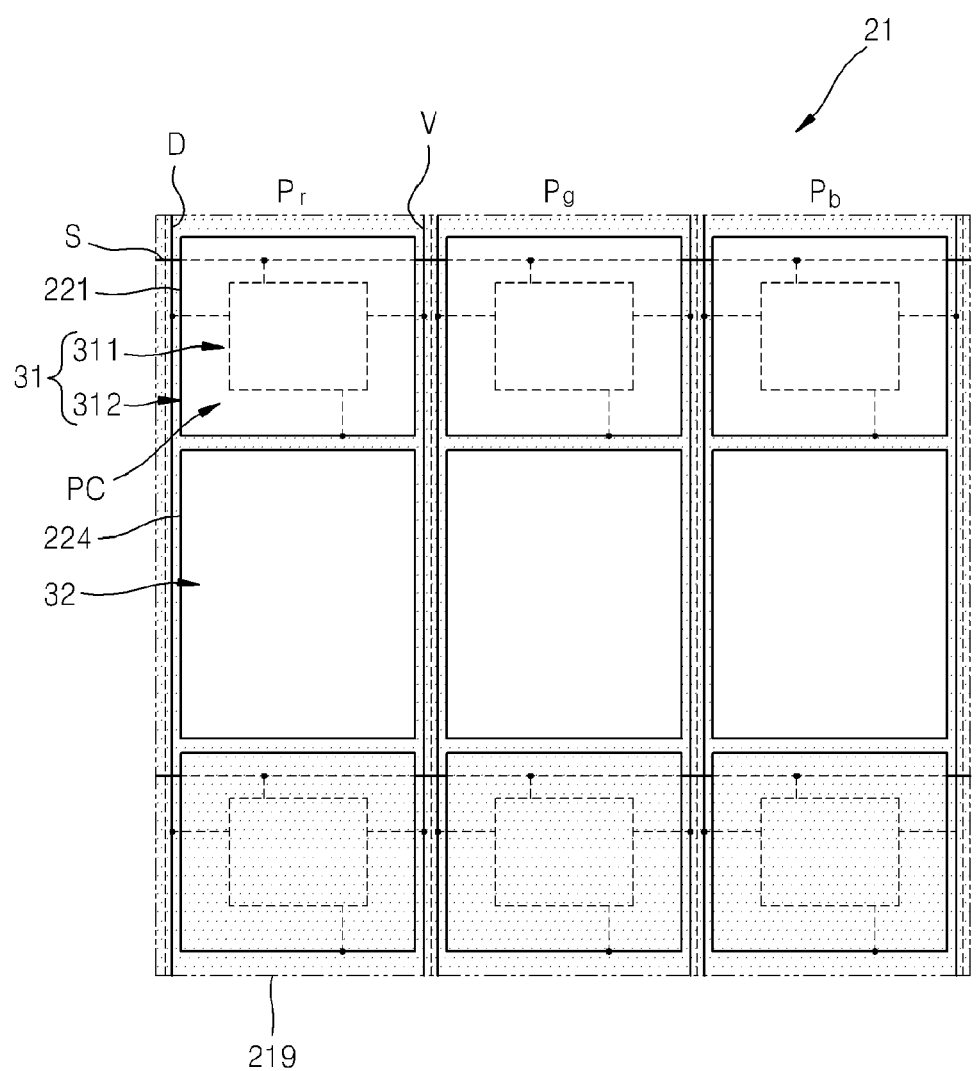
FIG. 8 is a schematic plan view of the organic emission unit included in the organic light-emitting display device of FIG. 3 or 4, according to another embodiment of the present invention.

FIG. 8 is a schematic plan view of the organic emission unit 21 included in the organic light-emitting display device of FIG. 3 or 4, according to another embodiment of the present invention. Referring to FIG. 8, a red pixel Pr, a green pixel Pg, and a blue pixel Pb are arranged to be adjacent to one another in the organic emission unit 21.

Each of the red pixel Pr, the green pixel Pg, and the blue pixel Pb includes a first region 31, in which a circuit region 311 and a light-emitting region 312 are formed to overlap each other. In the current embodiment of FIG. 8, the light-emitting region 312 is larger than a pixel circuit unit PC of the circuit region 311, and thus, the pixel circuit unit PC is completely hidden by the light-emitting region 312.

Each of the red pixel Pr, the green pixel Pg, and the blue pixel Pb further includes a second region 32 for transmitting external light, adjacent to the first region 31. Referring to FIG. 8, the second regions 32 of the red, green, and blue pixels Pr, Pg, and Pb, respectively, are separate from one another.

A plurality of conductive lines, such as a scan line S, a data line D, and a Vdd line V, are electrically connected to the pixel circuit unit PC. Although not shown, various other conductive lines besides the scan line S, the data line D, and the Vdd line V may further be connected to the pixel circuit unit PC according to the configuration of the pixel circuit unit PC.

Figure 9:
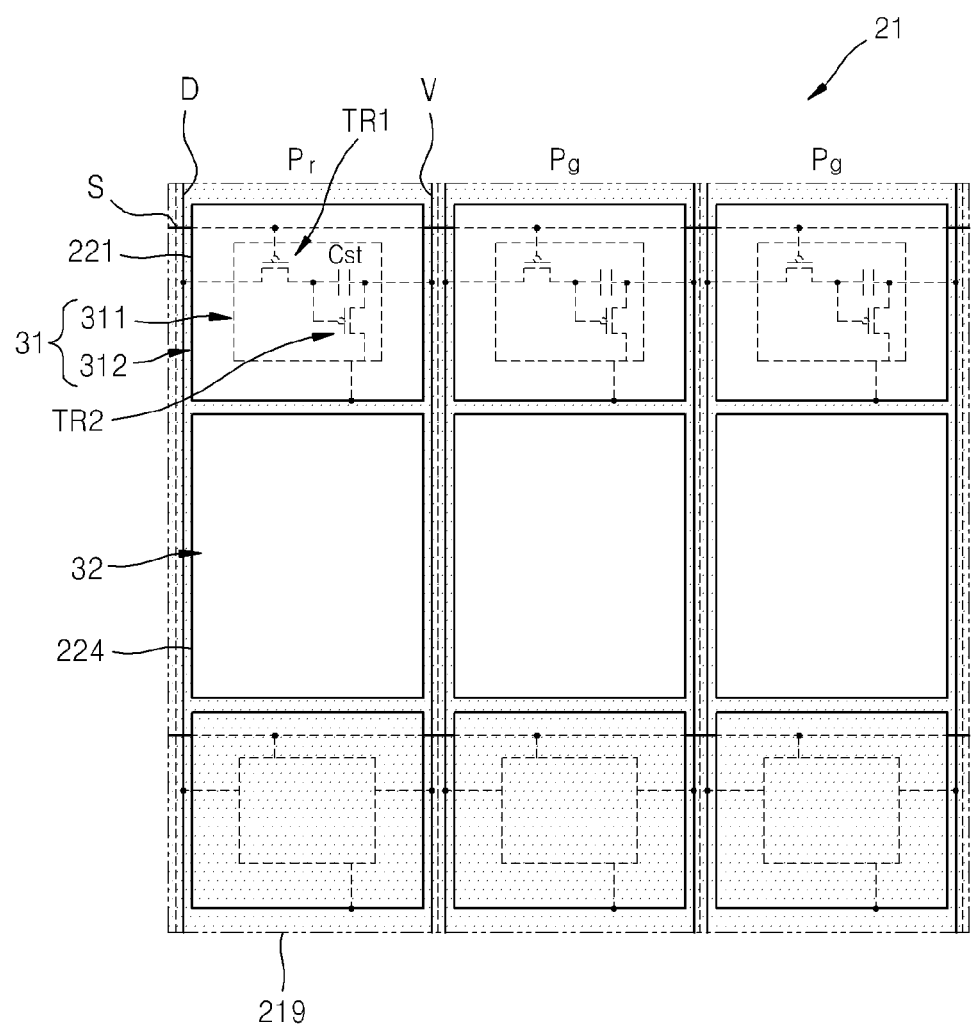
FIG. 9 is a schematic drawing of a pixel circuit unit included in the organic emission unit of FIG. 8, according to an embodiment of the present invention.

FIG. 9 is a schematic drawing of the pixel circuit unit PC included in the organic emission unit 21 according to an embodiment of the present invention. Referring to FIG. 9, the pixel circuit unit PC includes a first TFT TR1 connected to the scan line S and the data line D, a second TFT TR2 connected to the first thin film transistor TR1 and the Vdd line V, and a capacitor Cst connected to the first and second TFTs TR1 and TR2. The first TFT TR1 may be a switching transistor and the second TFT TR2 may be a driving transistor. The second TFT TR2 is electrically connected to the first electrode 221. In FIG. 9, the first and second TFTs TR1 and TR2 are P-type transistors but are not limited thereto, and at least one from among the first and second TFTs TR1 and TR2 may be an N-type transistor. Although three TFTs and one capacitor are used in the current embodiment, the present invention is not limited thereto, and two or more TFTs and one or more capacitors may be used according to the configuration of the pixel circuit unit PC.

Referring to FIGS. 8 and 9, the scan line S overlaps with the first electrode 221 but the present invention is not limited thereto. For example, at least one from among the plurality of conductive lines including the scan line S, the data line D, and the Vdd line V may overlap with the first electrode 221, and in some cases, all the plurality of conductive lines may overlap with the first electrode 221 or may be arranged adjacent to the first electrode 221.

In the current embodiment, since the first and second regions 31 and 32 are separated from each other, distortion of an external image when external light scatters caused by the patterns of the devices in the pixel circuit unit PC, may be prevented. The first and second regions 31 and 32 may be formed in such a manner that a ratio of the area of the second region 32 to the whole area of the first and second regions 31 and 32 falls within a range from 5% to 90%.

If the ratio of the area of the second region 32 to the whole area of the first and second regions 31 and 32 is less than 5%, a user can hardly see an object or image on a side opposite to the user as little light can pass through the display unit 2 of FIG. 1. Even if the ratio of the area of the second region 32 to the whole area of the first and second regions 31 and 32 is less than 5%, the first region 31 is present in an island state with respect to the second region 32, and scattering of light is minimized since all conductive patterns are disposed across the first region 31. Thus, the display unit 2 may be recognized as a transparent display unit by the user. Furthermore, if a TFT included in the pixel circuit unit PC is a transparent TFT manufactured using, for example, an oxide semiconductor and an organic light-emitting diode is a transparent device, then the display unit 2 may further be recognized as a transparent display unit.

If the ratio of the area of the second region 32 to the whole area of the first and second regions 31 and 32 is greater than 90%, pixel integrity of the display unit 2 is excessively low. Thus, a stable image can hardly be realized through light emission in the first region 31. That is, the smaller the first region 31, the higher the brightness of light emitted from the organic layer 223 should be in order to realize an image. However, if the organic light-emitting diode is operated so as to emit light having a high intensity, the lifetime of the organic light-emitting diode is rapidly reduced. Also, if the ratio of the area of the second region 32 to the whole area of the first and second regions 31 and 32 is greater than 90% while the size of a single first region 31 is maintained at an appropriate size, then the first region 31 is too smaller than the second region 32, thereby lowering the resolution of the organic light-emitting diode.

In embodiments, the ratio of the area of the second region 32 to the whole area of the first and second regions 31 and 32 may be in a range of about 20% to about 70%. In the range of about 20% to about 70%, external images can be viewed through the second region 32 without difficulty and also there are not a lot of limitations in designing of the pixel circuit unit PC.

The first region 31 includes the first electrode 221 connected to the pixel circuit unit PC. The pixel circuit unit PC overlaps with the first electrode 221 so that the pixel circuit unit PC can be hidden or blocked by the first electrode 221. Also, at least one among the conductive lines including the scan line S, the data line D, and the Vdd line V may cross the first electrode 221. Otherwise, since transmissivity is less lowered by the conductive lines than by the pixel circuit unit PC, all the conductive lines may be arranged adjacent to the first electrode 221 according to design. Since the first electrode 221 includes a reflective layer formed of conductive metal for reflecting light as will be described later, it is possible to hide the pixel circuit unit PC overlapping the first electrode 221 and prevent distortion of an external image caused by the pixel circuit unit PC in the first region 31.

Figure 10:
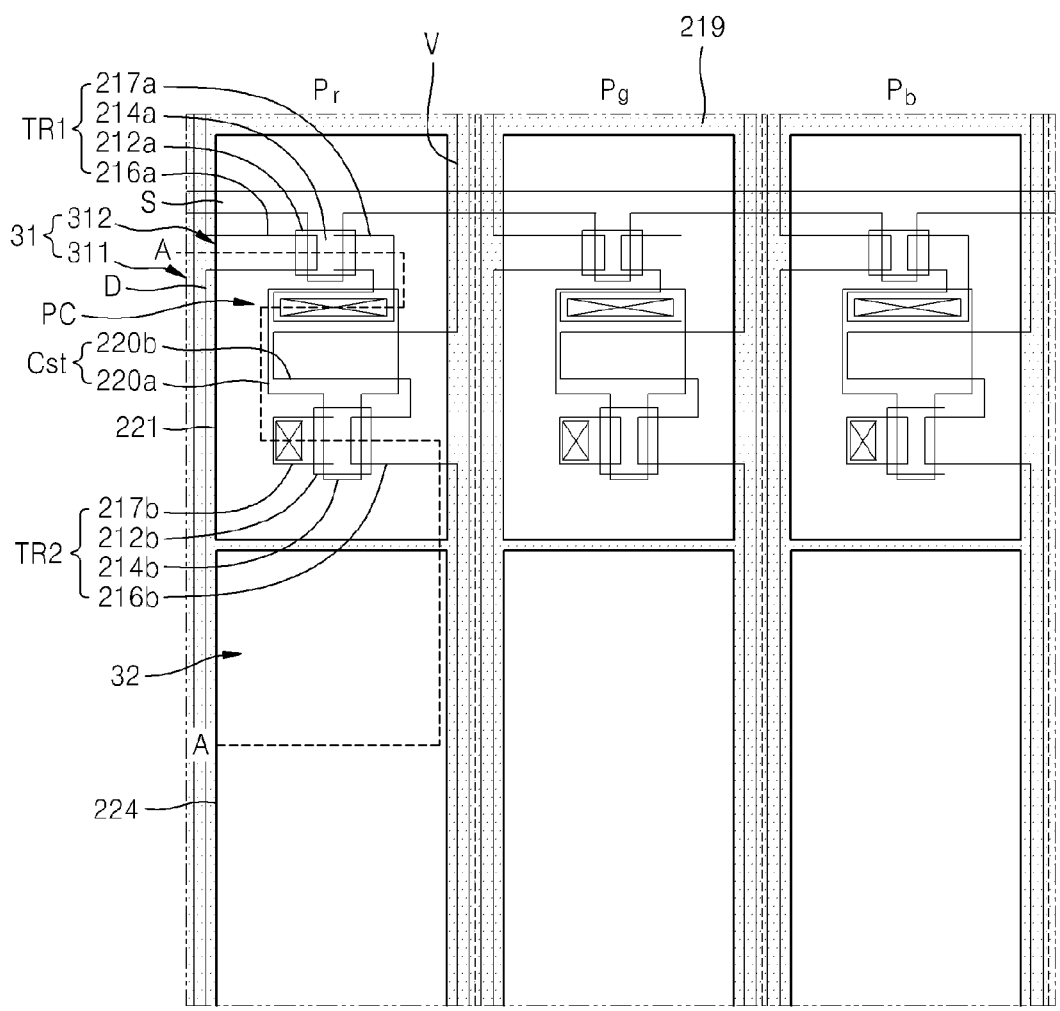
FIG. 10 is a plan view specifically illustrating the organic emission unit of FIG. 9, according to an embodiment of the present invention.
Figure 11:
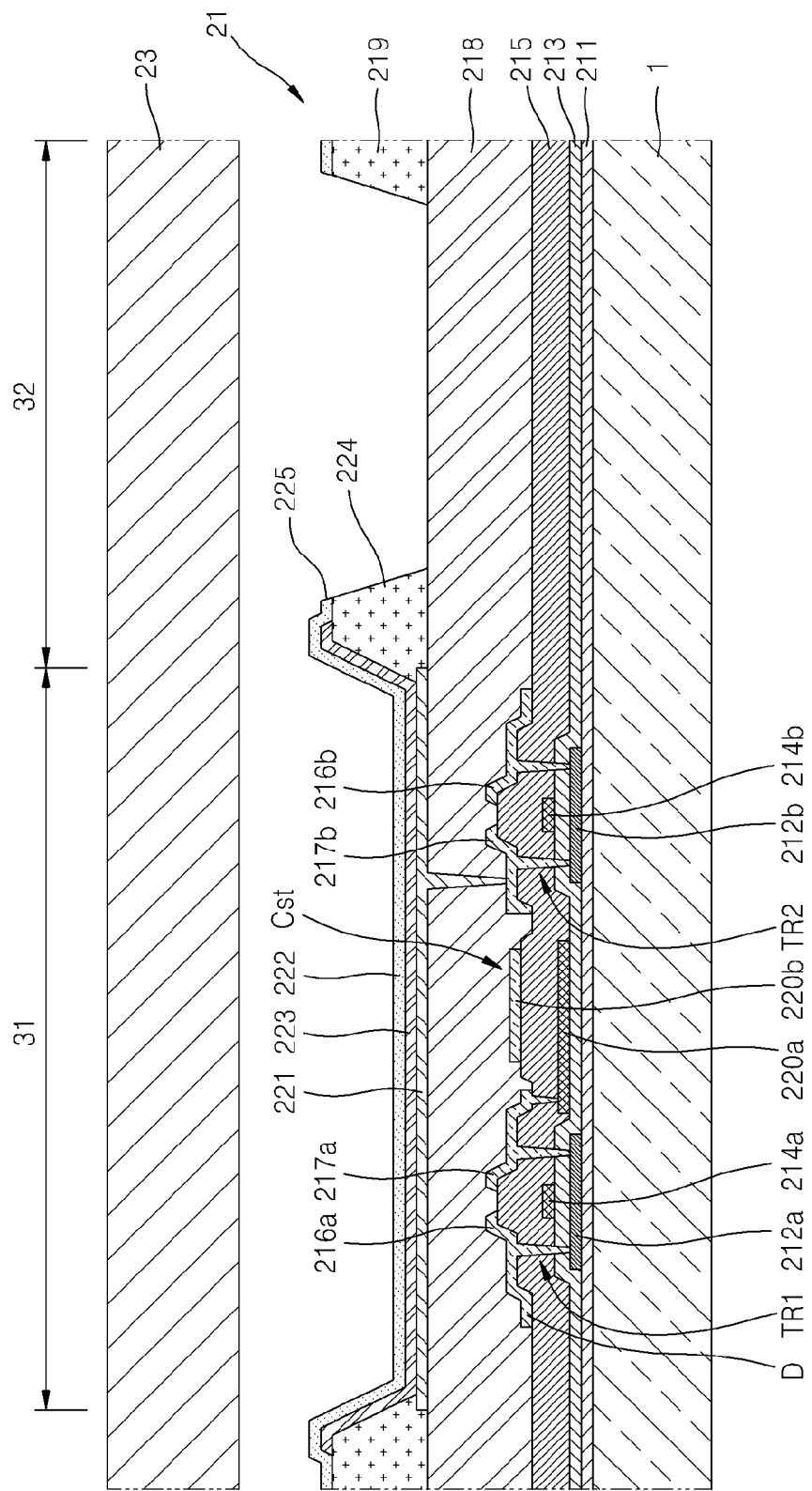
FIG. 11 is a cross-sectional view taken along a line A-A of FIG. 10, according to an embodiment of the present invention.

FIG. 10 is a plan view specifically illustrating the organic emission unit 21 of FIG. 9, according to an embodiment of the present invention. FIG. 11 is a cross-sectional view taken along a line A-A of FIG. 10, according to an embodiment of the present invention.

Referring to FIGS. 10 and 11, a buffer layer 211 is formed on a first surface 11 of the substrate 1, and a first TFT TR1, a capacitor Cst, and a second TFT TR2 are formed on the buffer layer 211. First, a first semiconductor active layer 212a and a second semiconductor active layer 212b are formed on the buffer layer 211.

The first and second semiconductor active layers 212a and 212b may be formed of, but are not limited to, polycrystalline silicon, and may be formed of an oxide semiconductor. For example, the first and second semiconductor active layers 212a and 212b may be G-I-Z-O layers [$(In_2O_3)a(Ga_2O_3)b(ZnO)c$ layer], wherein a, b, and c are integers that respectively satisfy $a \geq 0$, $b \geq 0$, and $c > 0$.

A gate insulating film 213 covering the first and second semiconductor active layers 212a and 212b is formed on the buffer layer 213, and first and second gate electrodes 214a and 214b are formed on the gate insulating layer 213. An interlayer insulating layer 215 is formed on the gate insulating film 213 to cover the first and second gate electrodes 214a and 214b. A first source electrode 216a and a first drain electrode 217a, and a second source electrode 216b and a second drain electrode 217b are formed on the interlayer insulating layer 215 to be connected to the first semiconductor active layer 212a and the second semiconductor active layer 212b through contact holes, respectively.

A scan line S may be substantially simultaneously formed with the first and second gate electrodes 214a and 214b. A data line D may be substantially simultaneously formed with the first source electrode 216a to be connected to the first source electrode 216a. A Vdd line V may be substantially simultaneously formed with the second source electrode 216b to be connected to the second source electrode 216b.

In a capacitor Cst, a lower electrode 220a is substantially simultaneously formed with the first and second gate electrodes 214a and 214b, and an upper electrode 220b is substantially simultaneously formed with the first drain electrode 217a.

The structures of the first TFT TR1, the capacitor Cst, and the second TFT TR2 are not limited thereto, and any of various types of TFT and capacitor structures may be employed. For example, in the current embodiment, the first and second TFTs TR1 and TR2 have a top gate structure but may be formed having a bottom gate structure below the first and second semiconductor active layers 212a and 212b, respectively. However, any other TFT structures may be employed.

A first insulating layer 28 is formed to cover the first TFT TR1, the capacitor Cst, and the second TFT TR2. The first insulating layer 218 may be a single layer or multiple layers of insulating film, an upper surface of which is planarized. The first insulating layer 218 may be formed of a transparent inorganic material and/or organic material.

Referring to FIGS. 10 and 11, a first electrode 221 covering the first TFT TR1, the capacitor Cst, and the second TFT TR2 is formed on the first insulating layer 218.

The first electrode 221 is connected to a second drain electrode 217b of the second TFT TR2 through a via hole formed in the first insulating layer 218. As shown in FIG. 8 or 9, each of a plurality of the first electrodes 221 corresponding to a plurality of pixels, respectively, may be formed in an island pattern to be separated from the other first electrodes 221.

A second insulating layer 219 covering edges of the first electrode 221 is formed on the first insulating layer 218. An organic layer 223 and a second electrode 222 are sequentially formed on the first electrode 221. The second electrode 222 is formed across all the first and second regions 31 and 32.

The first electrode 221 may function as an anode and the second electrode 222 may function as a cathode. Alternatively, the first electrode 221 may function as a cathode, and the second electrode 222 may function as an anode. Each of the plurality of first electrodes 221 corresponding to the plurality of pixels, respectively, has a size corresponding to the size of the first region 31. The second electrode 222 may be formed as a common electrode covering all the pixels included in the organic emission unit 21.

According to an embodiment of the present invention, the first electrode 221 may be a reflective electrode and the second electrode 222 may be a transparent electrode. Accordingly, the organic emission unit 21 is a top emission type in which an image displayed toward the second electrode 222.

In embodiments, the first electrode 221 may include a reflective film formed of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a compound of these materials, or an oxide having a high work function such as ITO, IZO, ZnO, or $In_2O_3$. The second electrode 222 may be formed of metal having a low work function, such as Ag, Mg, Al, Pt, Pd, Au, Ni, Nd, Ir, Cr, Li, Ca, or an alloy thereof. The second electrode 222 may be formed of a thin film having a high transmissivity.

If the first electrode 221 is a reflective electrode, then the pixel circuit unit PC disposed under the first electrode 221 is covered by the first electrode 221. Therefore, referring to FIG. 11, at upper outer sides of the second electrode 222, the user cannot view patterns of the first TFT TR1, the capacitor Cst, and the second TFT TR2 disposed under the second electrode 221, as well as portions of the scan line S, the data line D, and the Vdd line V.

As the first electrode 221 is a reflective electrode, light is emitted only toward a user, i.e., upward, thereby preventing or minimizing optical loss in a direction opposite to the user. Also, as described above, various patterns of the pixel circuit unit PC below the first electrode 221 are covered by the first electrode 221, and thus, a user may view a clear image.

In an embodiment of the present invention, the second insulating layer 219 includes a light absorbing material. The light absorbing material may be a colorant of black or a dark color similar to black, and may be included in an organic material and/or an inorganic material used to form the second insulating layer 219.

Since the second insulating layer 219 includes the light absorbing material, conductive patterns of the elements and wires of the pixel region 311 formed right below the second insulating layer 219 are completely hidden by the second insulating layer 219. In particular, referring to FIG. 10, since the pixel circuit unit PC, and conductive lines, such as the scan line S, the data line D, and the Vdd line V, are completely covered by the second insulating layer 219, a user cannot view conductive patterns of the pixel circuit unit PC and the conductive lines from a lower surface of the substrate 1 or an upper surface of the sealing substrate 23, thereby preventing image distortion or color separation from occurring.

As described above, since the first insulating layer 218, the interlayer insulating layer 215, the gate insulating layer 213, and the buffer layer 211 are formed of a transparent insulating material, at least parts of the conductive lines may be exposed even if the pixel circuit unit PC is covered by the first electrode 221. The exposed conductive lines may function as multiple slits through which external light is transmitted, and thus, not only an external image penetrating the first region 31 may be distorted but also color separation may occur.

In order to solve this problem, the light absorbing material is included in the second insulating layer 219 formed on the conductive patterns so as to prevent multiple slit effect from occurring, thereby preventing image distortion and color separation.

Also, in the current embodiment, a first transmittance window 224 is formed on a location on the second insulating layer 219, which corresponds to the second region 32. The first transmittance window 224 may be formed by removing or not forming the second insulating layer 219 in the second region 32. Referring to FIG. 10, each of a plurality of first transmittance windows 224 corresponding to the red, green, and blue pixels Pr, Pg, and Pb, respectively, may be formed in an island pattern and apart from the other first transmittance windows 224.

A second transmittance window 225 may be formed in the second electrode 222 in the second region 32 overlapping the first transmittance window 224. The second transmittance window 225 may be formed by removing or not forming the second electrode 222 in the second region 32. Each of a plurality of second transmittance windows 225 corresponding to the red, green, and blue pixels Pr, Pg, and Pb, respectively, may be formed in an island pattern and apart from the other second transmittance windows 225.

Figure 12:
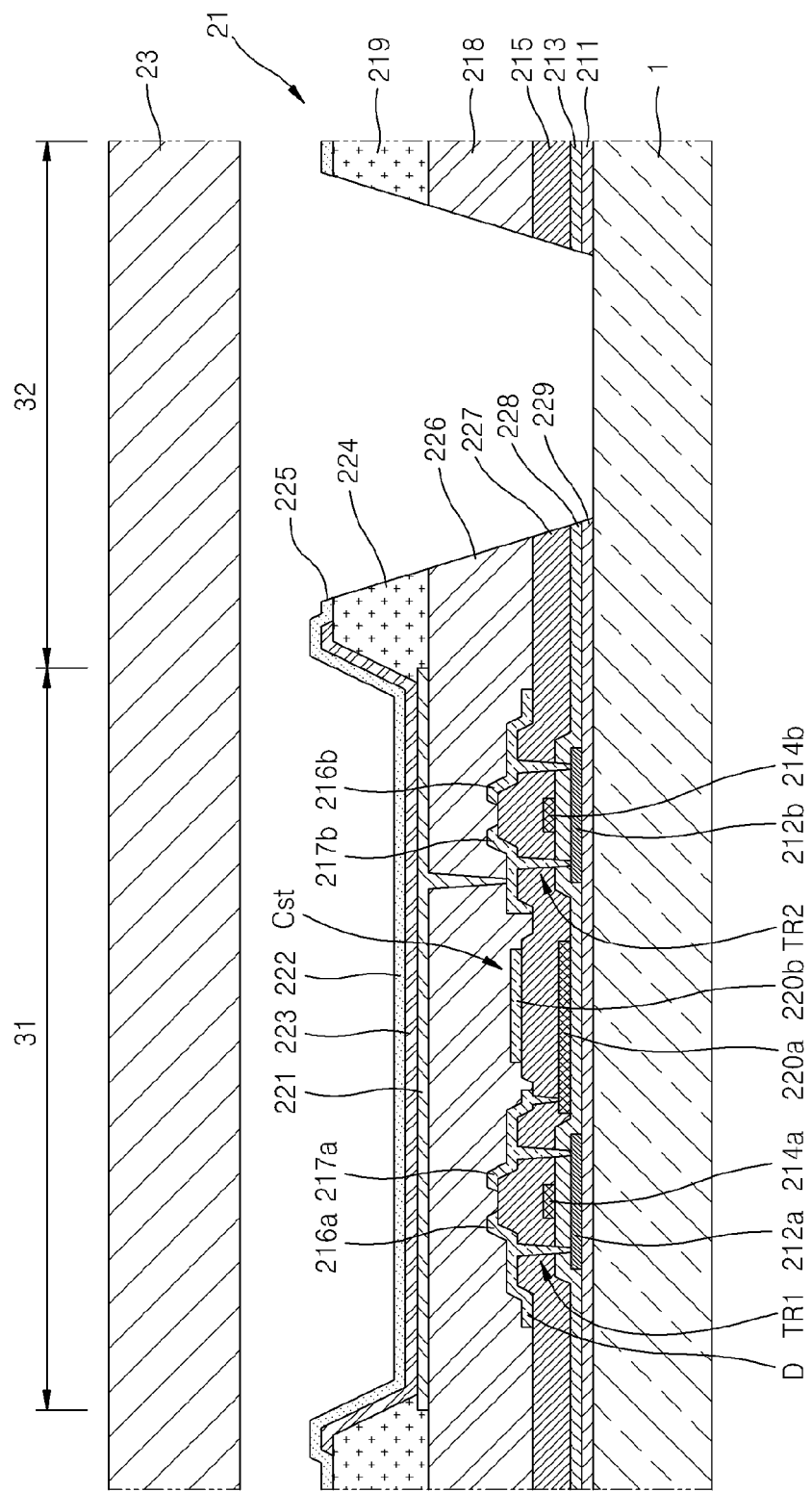
FIG. 12 is a cross-sectional view taken along the line A-A of FIG. 10, according to another embodiment of the present invention.

FIG. 12 is a cross-sectional view taken along the line A-A of FIG. 10, according to another embodiment of the present invention, in which additional transmittance windows are formed in insulating layers below the second insulating layer 219 in the second region 32. The additional transmittance windows may be formed as wide as possible as long as they do not interrupt the scan line S, the data line D, and the Vdd line V. The additional transmittance windows may be connected to a first transmittance window 224.

A third transmittance window 226, a fourth transmittance window 227, a fifth transmittance window 228, and a sixth transmittance window 229 may be formed on the insulating layer 218, the interlayer insulating layer 215, the gate insulating layer 213, and the buffer layer 211, respectively.

Figure 13:
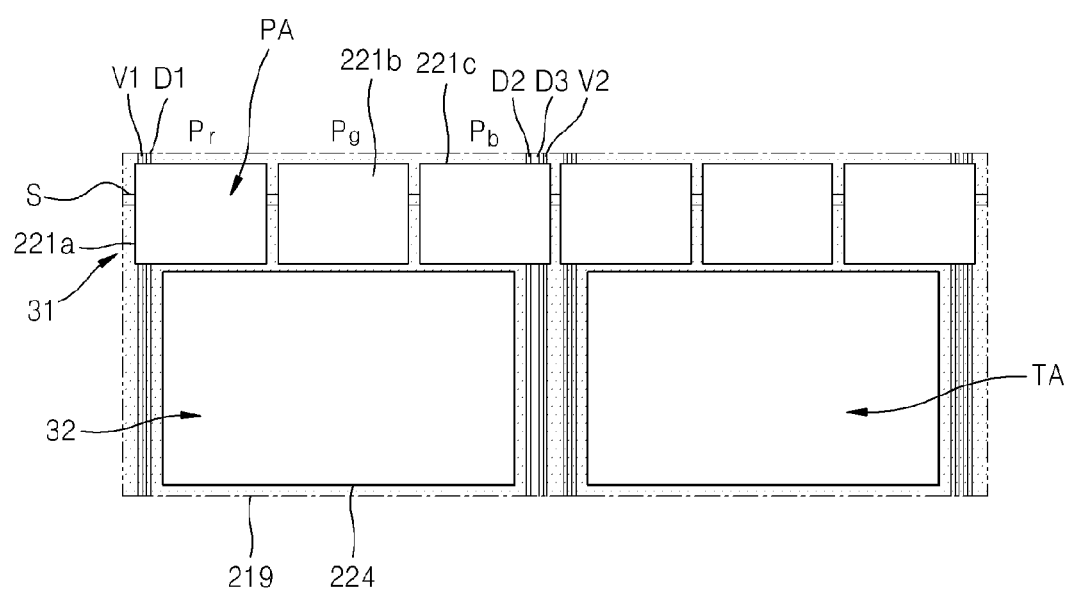
FIG. 13 is a schematic plan view of the organic emission unit included in the organic light-emitting display device of FIG. 3 or 4, according to another embodiment of the present invention.

FIG. 13 is a schematic plan view of the organic emission unit 21 included in the organic light-emitting display device of FIG. 3 or 4, according to another embodiment of the present invention. Referring to FIG. 13, a second region 32 corresponds to first electrodes 221$a$, 221$b$, 221$c$ of red pixel Pr, green pixel Pg, and blue pixel Pb. First to third data lines D1 to D3 are electrically connected to the first electrode 221$a$ of the red pixel Pr, the first electrode 221$b$ of the green pixel Pg, and the first electrode 221$c$ of the blue pixel Pb, respectively. A first Vdd line V1 is electrically connected to the first electrode 221$a$ of the red pixel Pr and the first electrode 221$b$ of the green pixel Pg, and a second Vdd line V2 is electrically connected to the first electrode 221$c$ of the blue pixel Pb.

In the current embodiment, one large second region 32 corresponds to three pixels, e.g., the red, green, and blue pixels Pr, Pg, and Pb, thereby improving the transmissivity of the organic emission unit 21 and minimizing image distortion, caused by optical scattering.

Also, a first transmittance window 224 is formed in the second region 32 at a location where the second insulating layer 219 would have been provided. The first transmissive window 224 greatly improves the transmissivity of the organic emission unit 21.

According to the above embodiments of the present invention, it is possible to manufacture a transparent organic light-emitting display device that prevents distortion of an image transmitted therethrough by preventing light from scattering during image display.

Also, it is possible to prevent image distortion and color separation by preventing conductive lines from functioning as multiple slits through which external light can be transmitted.

Furthermore, it is possible to increase a contrast ratio by preventing external light from being reflected.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display device comprising:
a substrate comprising a major surface;
a plurality of pixels formed over the major surface of the substrate, each of the plurality of pixels comprising a first region and a second region that is not overlapping with the first region when viewing in a direction perpendicular to the major surface of the substrate;
a plurality of pixel circuit units, each of which comprises at least one thin film transistor formed in the first region of each of the plurality of pixels;
a first insulating layer covering the plurality of pixel circuit units;
a plurality of first electrodes formed over the first insulating layer, each of the plurality of first electrodes being disposed in the first region of each of the plurality of pixels;
a second insulating layer formed over the first insulating layer and comprising a light absorbing material, the second insulating layer defining a plurality of first transmittance windows in the plurality of second regions, each of the first transmittance windows configured to transmit external light incident to the device, wherein the second insulating layer comprises a portion interposed, when viewing in the direction, and thereby dividing between the first and second regions within a single one of the plurality of pixels;
an organic layer formed on each of the plurality of first electrodes; and
a second electrode formed over the organic layer and the second insulating layer.

2. The organic light-emitting display device of claim 1, wherein the plurality of first electrodes are made of a material that is substantially transmitting visible light therethrough.

3. The organic light-emitting display device of claim 1, wherein the plurality of first electrodes are substantially reflective of visible light.

4. The organic light-emitting display device of claim 1, wherein the first transmittance windows of two adjacent pixels are separated from one another.

5. The organic light-emitting display device of claim 1, wherein at least two adjacent pixels provide a first combined transmittance window that extends over the at least two adjacent pixels.

6. The organic light-emitting display device of claim 1, wherein the second electrode defines a plurality of second transmittance windows in the plurality of second regions, wherein the first and second transmittance windows of a single pixel overlap with each other.

7. The organic light-emitting display device of claim 1, wherein the first insulating layer comprises a plurality of third transmittance windows, wherein the first and third transmittance windows of a single pixel overlap with each other when viewing in the direction.

8. The organic light-emitting display device of claim 1, wherein the first region of each of the plurality of pixels comprises a light-emitting region and a circuit region,
wherein the at least one thin film transistor is disposed in the circuit region, wherein one of the plurality of first electrodes is disposed in the light-emitting region, and wherein the light-emitting region and the circuit region of each of the plurality of pixels are disposed adjacent to each other.

9. The organic light-emitting display device of claim 1, wherein the first region of each of the plurality of pixels further comprises a circuit region,
wherein the light-emitting region overlaps with the circuit region when viewing in the direction.

10. The organic light-emitting display device of claim 9, wherein the first electrode of each of the plurality of pixels is about the same size as the first region of each pixel.

11. An organic light-emitting display device comprising:
a substrate comprising a major surface;
a plurality of pixels formed over the major surface of the substrate, each of the plurality of pixels comprising a first region and a second region that is not overlapping with the first region of the same pixel when viewing in a direction perpendicular to the major surface of the substrate;
the first region of each pixel comprising a thin film transistor, a first electrode and an organic layer;
the second region of each pixel comprising a first transmittance window for transmitting external light incident to the device;
an insulating layer comprising a light absorbing material and defining a plurality of the first transmittance windows in the plurality of second regions, wherein the insulating layer comprises a portion interposed, when viewing in the direction, and thereby dividing between the first and second regions within a single one of the plurality of pixels; and
a second electrode formed over the organic layer and the insulating layer.

12. The organic light-emitting display device of claim 11, wherein the first electrode comprises a substantially light-transmitting material.

13. The organic light-emitting display device of claim 11, wherein the first electrode comprises a substantially light-reflective material.

14. The organic light-emitting display device of claim 11, wherein the first transmittance windows of two adjacent pixels are disposed apart from one another.

15. The organic light-emitting display device of claim 11, wherein at least two adjacent pixels provide a first combined transmittance window that extends over the at least two adjacent pixels.

16. The organic light-emitting display device of claim 11, wherein the second electrode defines a plurality of second transmittance windows in the plurality of second regions, wherein the first and second transmittance windows of a single pixel overlap with each other when viewing in the direction.

17. The organic light-emitting display device of claim 11, further comprising at least one insulating layer,
wherein the at least one insulating layer comprises a plurality of third transmittance windows, wherein the first and third transmittance windows of a single pixel overlap with each other when viewing in the direction.

18. The organic light-emitting display device of claim 11, wherein the first region of each of the plurality of pixels comprises a light-emitting region and a circuit region,
wherein the thin film transistor is disposed in the circuit region, wherein one of the plurality of first electrodes is disposed in the light-emitting region, and wherein the light-emitting region and the circuit region of each of the plurality of pixels are disposed adjacent to each other.

19. The organic light-emitting display device of claim 11, wherein the first region of each of the plurality of pixels comprises a light-emitting region and a circuit region,
wherein the light-emitting region overlaps with the circuit region when viewing in the direction.

20. The organic light-emitting display device of claim 19, wherein the first electrode of each of the plurality of pixels is about the same size as the first region of each pixel.

* * * * *